United States Patent [19]

Mariner et al.

[11] Patent Number: 5,537,507
[45] Date of Patent: Jul. 16, 1996

[54] COATED FLASH EVAPORATOR HEATER

[75] Inventors: John T. Mariner, Avon Lake; Timothy J. Hejl, Parma; Douglas A. Longworth, Cleveland Hts.; Lawrence E. Finley, Pepper Pike, all of Ohio

[73] Assignee: Advanced Ceramics Corporation, Lakewood, Ohio

[21] Appl. No.: 314,411

[22] Filed: Sep. 28, 1994

[51] Int. Cl.[6] .............................. B01D 7/00; C23C 16/00
[52] U.S. Cl. .............................. 392/389; 118/726
[58] Field of Search .................... 392/388, 389; 118/726, 727

[56] References Cited

U.S. PATENT DOCUMENTS

| | | | |
|---|---|---|---|
| 3,020,177 | 2/1962 | Alexander | 118/726 |
| 3,430,937 | 3/1969 | Spitzer | 392/389 |
| 3,582,611 | 6/1971 | Matheson | 392/389 |
| 4,264,803 | 4/1981 | Shinko | 392/389 |
| 5,035,201 | 7/1991 | Parent | 392/389 |
| 5,239,612 | 8/1993 | Morris | 392/389 |

*Primary Examiner*—Teresa J. Walberg
*Assistant Examiner*—Jam Paik
*Attorney, Agent, or Firm*—Eugene Lieberstein; Michael N. Meller

[57] ABSTRACT

A flash evaporator heater including a substrate formed of an intermetallic compound or of graphite and having an outer coating composed of pyrolytic boron nitride or pyrolytic graphite. The substrate has a substantially rectangular configuration with a substantially flat upper surface and a recessed cavity. The cavity has a longitudinal cross sectional geometry which forms a slope intersecting the substantially flat upper surface of the substrate at an angle α of less than 60 degrees.

5 Claims, 2 Drawing Sheets

COATED FLASH EVAPORATOR HEATER

FIELD OF INVENTION

This invention relates to a coated flash evaporator heater and more particularly to a flash evaporator resistance heater for the vacuum vaporization of metals having a pyrolytic boron nitride "PBN" coating or a coating of pyrolytic graphite "PG" on a substrate composed of graphite or an intermetallic composite.

BACKGROUND OF THE INVENTION

Vacuum deposition is a common method for coating metals such as aluminum, copper, zinc, and tin onto various substrates of metal, glass and plastic. The metal is vaporized by means of electric resistance heating in a vessel commonly referred to as an "evaporator heater" or a "vaporization boat". The vessel is connected to a source of electrical power to heat the vessel to a temperature which will cause the metal charge in contact with the boat to vaporize. Usually, the metal is vaporized in an evacuated chamber in which the product to be coated is placed. The product may be individually introduced into the evacuated chamber, or continuously fed through the chamber or, alternatively, may form part of the chamber itself. A wide variety of product is coated with metal using vapor deposition including, e.g., television picture tubes, automobile headlights, toys and the like.

The metal charge is placed into a recessed cavity machined into the top surface of the vessel. Upon reaching the vaporization temperature of the metal the metal charge melts and quickly vaporizes. The charge flashes in a vigorous and abrupt manner and the process is repeated with a new charge of metal. The number of flashes which can be performed in a given time period controls product production. Accordingly, the number of flashes a vessel can sustain without failure is a critical performance characteristic of the process. Conversely, when failure occurs the parts being coated are scrapped or have to be redone which involves additional time and cost. To avoid this extra cost the vessel may be scrapped before its anticipated failure. The shorter the life of the vaporization vessel the higher the production costs per part which translates into reduced efficiency.

A flash evaporator heater is formed from a substrate which is typically composed from an intermetallic composite or from graphite and may be coated with an outer coating of pyrolytic boron nitride "PBN" or pyrolytic graphite "PG". The outer coating is usually formed by a conventional chemical deposition process. The substrate is generally of rectangular configuation with the recessed cavity machined into the substrate to form a lateral cross sectional geometry of hemispherical shape and a longitudinal cross sectional geometry, the ends of which are also of hemispherical shape. The hemispherical shaped cross sectional geometry of the cavity is consistent with the simple one step machining operation used in forming the cavity in the least expensive manner.

It has been discovered in accordance with the present invention that when the substrate is coated with PBN or PG the cross sectional geometry at the longitudinal ends of the cavity develop thermal stresses due to the relative length changes between the substrate and the coating during thermal cycling. It has been discovered that such thermal stress can be relieved by reshaping the longitudinal ends to form a more gradual transition. In a companion application U.S. Ser. No. 08/166470 filed by Applicant on Dec. 14, 1993 and entitled Boron Nitride Vaporization Vessel it was similarly discovered that by modifying the lateral cross sectional geometry of the cavity at the intersection with the top surface of the vessel to form an included angle with the top surface of greater than 90 degrees and preferably over 120 degrees the useful life of the vessel would be improved. Although this may inherently relieve some thermal stress it does not solve the major stress problem occuring from the existence of a differential coefficient of themal expansion "CTE" between the coating and the substrate. Such thermal stresses are greatest in the direction parallel to the greatest dimension where there is the greatest differential movement. This is obviously along its length.

SUMMARY OF THE INVENTION

It has been discovered in accordance with the present invention that internal stress developed by the existence of a differential coefficient of themal expansion "CTE" between the coating and the substrate can be minimized by reshaping the longitudinal ends to form a more gradual transition.

The flash evaporator heater of the present invention comprises: a substrate having an outer coating selected from the class consisting of pyrolytic boron nitride and pyrolytic graphite and a substantially rectangular configuration with a substantially flat upper surface and a recessed cavity, with said cavity having a longitudinal cross sectional geometry which forms a slope intersecting said substantially flat upper surface at an angle α of less than 60 degrees.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Flash evaporators in use today require a precise shape to match the resistance circuit. They are made long and narrow with the length and cross sectional dimensions used to determine the electrical resistance of the vessel. A heater 10 according to the present invention is composed of a substrate 12 composed of graphite or an intermetallic composite having a coating 14 of pyrolytic boron nitride or pyrolytic graphite. The coating 14 can be formed by any conventional chemical deposition process "CVD". A preferred CVD process for coating pyrolytic boron nitride is taught in U.S. Pat. No. 3,152,006 by the vapor phase reaction of ammonia and a boron halide such as boron trichloride. The coating 14 is usually no thicker than 0.030 inches and fully encapsulates the substrate 12 except for the ends 15 and 16 which are preferably exposed for making an electrical connection to a clamp assembly (not shown) for connecting the heater 10 to a source of electrical power.

Figure 1:
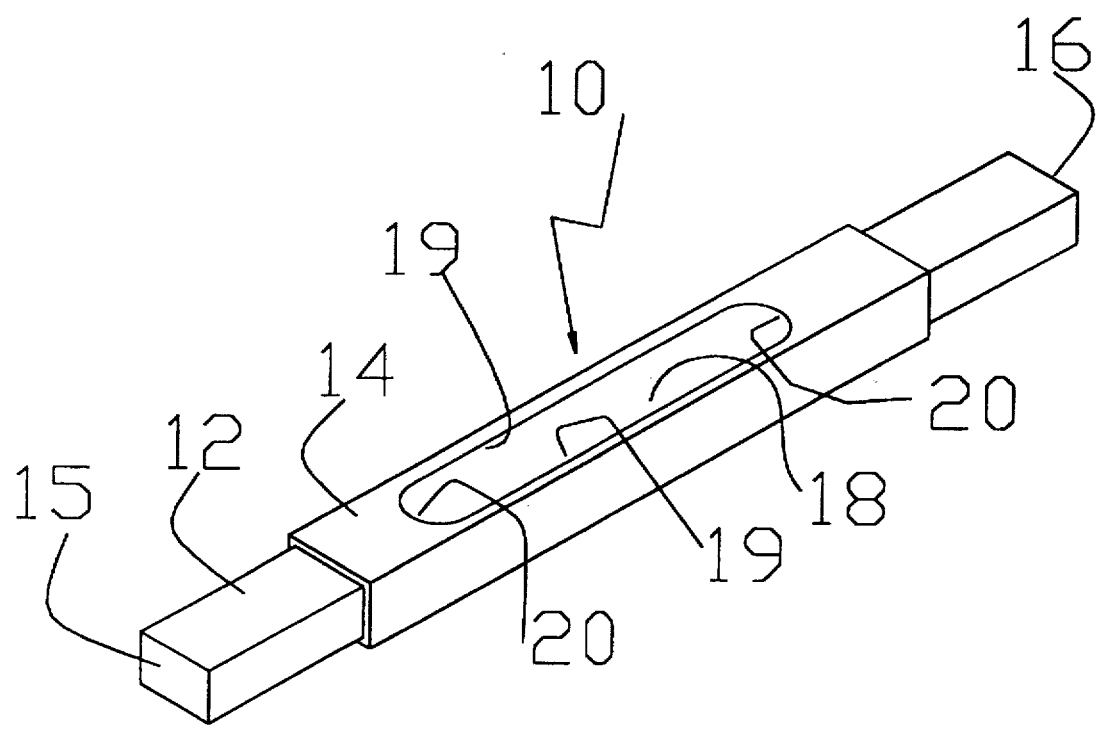
FIG. 1 is an isometric view of a typical prior art flash evaporator heater.
Figure 2:
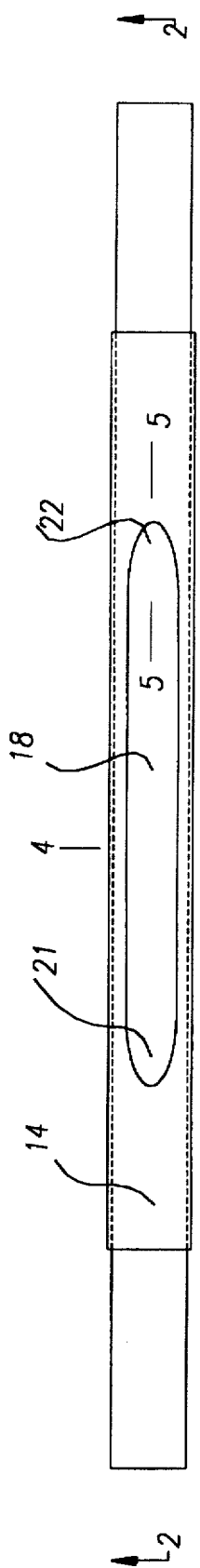
FIG. 2 is a top view of the flash evaporator heater of the present invention.
Figure 3:
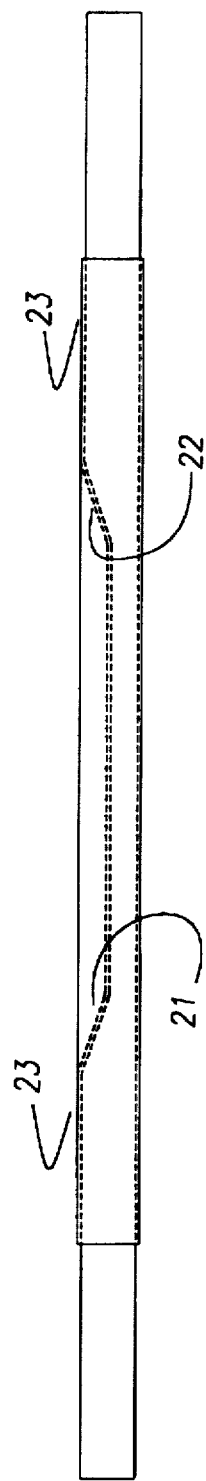
FIG. 3 is a longitudinal side view of the flash evaporator heater of FIG. 2.

A recessed cavity 18 is machined into the substrate 12 for forming a generally rectangular geometry. The typical geometry of the cavity 18 formed in accordance with the prior art is shown in FIG. 1 in which the lateral sides 19 and longidudinal ends 20 are hemispherical in shape. The CTE of the coating 14 will not, as a practical matter, match the CTE of the substrate 12 and although the mismatch can be minimized by trying to match the CTE of the cover to the substrate the CTE mismatch can never be eliminated. In fact, since most CVD processes are run at substantially elevated temperatures which are often in excess of 1000° C. or even up to or above 2000° C. even slight differences in CTE can build up significant strains. Moreover, even if steps are taken to minimize the strain whatever strain is left will tend to build up in the areas of transitioning geometry. Additionally, when flash evaporating aluminum each themal cycle will induce some thermal strain. The more concentrated and localized this strain becomes the greater will be the stress. Any transition which will distribute the strain will reduce the stress.

It was discovered in accordance with the present invention that the the greatest stress will build up at the ends 21 and 22 of the cavity 18, as is shown in FIGS. 2–5. Differential CTE stresses are greatest parallel to the greatest dimension where there is the greatest differential movement. This is obviously along the length. This stress is the worst if it is perpendicular to some barrier. In the prior art the direction of the greatest strain is essentially perpendicular to the PBN surface inside the top ends of the cavity. Furthermore, any diffferential strain in a vertical direction is essentially parallel to the PBN surface inside the top ends of the cavity.

Figure 5:
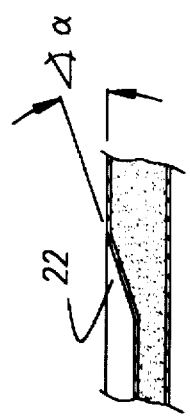
FIG. 5 is a longitdinal cross section of one end of the heater cavity of FIG. 1 taken along the lines 4—4 of FIG. 1.

In accordance with the present invention the longitudinal ends 21 and 22 are shaped to cause a gentle transition from the flat top 23 to the cavity interior which increases the lengthwise space of the cavity 18 and spreads out any CTE induced strain and as such minimize stress. By forming a slope with a gradual transition at the ends 21 and 22 of the cavity 18 provides two advantages; to wit: (1) The stresses are distributed along the interface between the PBN coating and the substrate. In this case the maximum strain is not perpendicualr to the surface. (2) The vertical component of the differential CTE now provides a virtual gap in the lengthwise direction. For any given differential shrinkage of the graphite substrate relative to the coating in the vertical drection there will be an even bigger allowance in the horizontal direction. The slope formed at the ends 21 and 22 is preferably linear but may be non-linear. Geometrically as shown in FIG. 5, for any angle α, per unit shrinkage vertically, there will be a horizontal virtual gap of cotangent α. Thus if the angle x is 30 degrees a horizontal allowance will be generated of 1.73 times the vertical change. Accordingly, the angle α should be an acute angle of less than 60 degrees and preferably less than 30 degrees.

Figure 4:
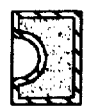
FIG. 4 is a lateral cross section taken along the lines 3—3 of FIG. 1.

There are many ways in which the longitudinal ends 21 and 22 of the cavity 18 may be sloped to provide the desired angle α. For example, the cavity 18 may be machined with a grinding wheel with the rotational axis of the wheel perpendicular to the cavity and may or may not translate along the cavity. The cavity side cross section may, as shown in FIG. 4, be hemispherical or may be determined by the selected cross sectional shape of the grinding wheel at the grinding wheel periphery. The cavity end transition will be determined by the grinding wheel diameter. Alternatively, the cavity can be machined with an end mill allowing the mill to gradually approach and leave the cavity over some transition length. Another alternative would be to machine the cavity in two operations. In determining the transition length and shape the more gradual the shape the better but this must be balanced with total cavity area and proximity of the cavity ends to the ends of the heater.

What we claim is:

1. A flash evaporator heater comprising: a substrate having an outer coating selected from the class consisting of pyrolytic boron nitride and pyrolytic graphite and a substantially rectangular configuration with a substantially flat upper surface and a recessed cavity, with said cavity having a longitudinal cross sectional geometry which forms a slope intersecting said substantially flat upper surface at an angle α of less than 60 degrees.

2. A flash evaporator heater as defined in claim 1 wherein said angle α is equal to or less than 30 degrees.

3. A flash evaporator heater as defined in claim 2 wherein said substrate is selected from the class consisting of graphite and an intermetallic composite.

4. A flash evaporator heater as defined in claim 2 wherein said substrate is composed of graphite and said cover is composed of pyrolytic boron nitride.

5. A flash evaporator heater as defined in claim 2 wherein said slope is non-linear.

* * * * *